(12) United States Patent
Eguchi et al.

(10) Patent No.: US 6,507,191 B1
(45) Date of Patent: Jan. 14, 2003

(54) NMR CELL SYSTEM FOR SUPERCRITICAL FLUID MEASUREMENTS AND HIGH-PRESSURE CELL FOR NMR

(75) Inventors: Takefumi Eguchi, Kanagawa (JP); Mamoru Imanari, Tokyo (JP); Yoshiaki Yamakoshi, Tokyo (JP)

(73) Assignee: JEOL Ltd., Tokyo (JP)

( * ) Notice: Subject to any disclaimer, the term of this patent is extended or adjusted under 35 U.S.C. 154(b) by 84 days.

(21) Appl. No.: 09/656,976

(22) Filed: Sep. 7, 2000

(30) Foreign Application Priority Data

Sep. 9, 1999 (JP) ............................................. 11-255526
Sep. 17, 1999 (JP) ............................................. 11-264015

(51) Int. Cl.$^7$ ................................................. G01V 3/00
(52) U.S. Cl. ....................... 324/318; 324/305; 324/307; 324/309; 324/321
(58) Field of Search ................................. 324/318, 304, 324/305, 308, 307, 309, 310, 321

(56) References Cited

U.S. PATENT DOCUMENTS

| | | | | |
|---|---|---|---|---|
| 4,564,811 A | * | 1/1986 | Walker | 324/300 |
| 5,122,745 A | * | 6/1992 | Smith et al. | 324/300 |
| 5,313,162 A | * | 5/1994 | De Graaf et al. | 324/300 |
| 5,397,989 A | * | 3/1995 | Spraul et al. | 324/318 |
| 5,530,353 A | * | 6/1996 | Blanz | 324/315 |
| 5,726,570 A | * | 3/1998 | Spraul et al. | 324/306 |
| 6,198,281 B1 | * | 3/2001 | Wand et al. | 324/300 |

* cited by examiner

Primary Examiner—Edward Lefkowitz
Assistant Examiner—Dixomara Vargas
(74) Attorney, Agent, or Firm—Webb Ziesenheim Logsdon Orkin & Hanson, P.C.

(57) ABSTRACT

There is disclosed an NMR cell system for supercritical fluid measurements. This cell system has an NMR cell in which convection is prevented. A reactive gas and a reactive liquid can be smoothly introduced into the NMR cell. The oxygen (air) inside the NMR cell can be removed before measurement. The NMR cell system comprises a cylindrical cell, a cell holder, and an external pumping system. The cylindrical cell and the cell holder are made of a nonmagnetic material that withstands high temperatures, high pressures, and strong acidity. A pipe is mounted inside the cell holder to connect the external pumping system into the cell. A high-pressure cell for use with an NMR spectrometer is also disclosed. This high-pressure cell comprises a pressure-proof cell for receiving a sample, a pressure transfer tube for transmitting pressure to the sample in the cell, and a coupling portion for coupling together the pressure-proof cell and the tube. The pressure-proof cell is detachably mounted to the coupling portion via a sealing member.

17 Claims, 6 Drawing Sheets

NMR CELL SYSTEM FOR SUPERCRITICAL FLUID MEASUREMENTS AND HIGH-PRESSURE CELL FOR NMR

BACKGROUND OF THE INVENTION

1. Field of the Invention

The present invention relates to an NMR cell system used for NMR measurements of supercritical fluids created under high-temperature and high-pressure conditions and to a high-pressure cell for use in an NMR spectrometer.

2. Description of the Related Art

When a fluid is placed at temperature and pressure conditions exceeding its critical point, the fluid becomes a supercritical fluid. The supercritical fluid has physical properties intermediate between those of gas phase and those of liquid phase. The physical properties (i.e., density, solubility, viscosity, dielectric constant, and self-diffusion coefficient) of the supercritical fluid are widely different from the physical properties in the ordinary liquid state. The supercritical fluid has a smaller density than in the liquid state, a higher solubility than in the liquid state, a lower viscosity than in the liquid state, a higher dielectric constant than in the liquid state, and a higher self-diffusion coefficient than in the liquid state. The physical properties can be varied continuously over a wide range by using the pressure or temperature as a parameter. Today, extraction methods and separation methods utilizing such physical properties intrinsic in supercritical fluids have been developed, and these methods find wide acceptance in food and chemical industries. Furthermore, there exists supercritical fluid chromatography (SFC) that is an analytical procedure making use of the properties of supercritical fluids.

Research into chemical reactions within supercritical fluids is a research field that has recently attracted attention, because a supercritical fluid has unique features that cannot be found in ordinary solutions. That is, it has a high solubility and a high diffusivity. In addition, the density can be varied continuously. If a supercritical fluid is regarded as a chemical reaction field, there is a possibility that a new field of reaction research different from chemical reactions within ordinary solutions is established. For example, in the case of water, at the subcritical state that is in immediate vicinity to the supercritical state, it is known that water exhibits strong acidity unlike normal water and dissolves various metals. It is found that water in the supercritical state dissolves polymeric organic substances, such as polyethylene terephthalate (PET), and substances that contaminate the environment, such as dioxin. It is expected that water in the supercritical state will be used as a chemical recycle technique for conserving the global environment.

Accordingly, there is an urgent demand for establishment of a technique for directly observing supercritical fluids by NMR. However, supercritical fluids exhibit various temperatures and pressures, depending on substances. FIG. 1 shows the distributions of the critical points of various chemical substances. As can be seen from the diagram of FIG. 1, where gaseous carbon dioxide in the supercritical state is observed, the temperature should be set to lower than 100° C. and the pressure should be set to lower than 10 MPa. However, where water in the supercritical state should be observed, a higher temperature of around 400° C. and a higher pressure of around 30 MPa are required. Accordingly, various NMR cell systems capable of coping with various experimental conditions and used for supercritical fluid measurements have been devised.

FIG. 2 shows a conventional NMR cell system used for supercritical fluid measurements. This system includes a cylindrical NMR cell 1 having a bottom. The cell is made of a ceramic such as zirconia or glass. The NMR cell 1 has an open end at which a cell holder 2 is mounted. The cell holder 2 is made of a nonmagnetic titanium alloy to prevent perturbation of the static magnetic field in the NMR spectrometer. The cell holder 2 is connected with a pressure transfer tube 4 made of stainless steel via a pipe connector portion 3 made of a titanium alloy and stainless steel.

In experiments using supercritical carbon dioxide, very high temperatures or very high pressures are not required. In this case, the NMR cell 1 is directly filled with liquefied carbon dioxide. Then, pressure is applied to the carbon dioxide from the pressure transfer tube 4. Under this condition, the cell 1 is inserted into an NMR probe (not shown). Thereafter, it is heated to a high temperature by a sample temperature control device (not shown), thus creating a supercritical fluid. Then, NMR measurements are performed. In experiments using alcohol or water, considerable high temperatures and pressures are required. In this case, facilities are also mounted outside the NMR cell 1 to apply a high pressure. This eliminates the pressure difference between the inside and the outside of the NMR cell 1. In this way, the NMR cell 1 is prevented from being destroyed due to pressure.

The conventional NMR cell system constructed in this way and fused for supercritical fluid measurements has the following problem. The bottom of the NMR cell is rapidly heated by the temperature control device. On the other hand, the top of the NMR cell is not heated as much by the temperature control device. Thus, a large temperature difference is created between these two portions. Therefore, if a supercritical fluid is created around the bottom of the NMR cell, the sample remains at the normal liquid state around the top of the NMR cell.

Since the density of a supercritical fluid is about one order of magnitude smaller than that of a normal fluid, if a high-temperature, low-density supercritical fluid phase is produced around the bottom of the NMR cell, a violent convection occurs with the low-temperature, high-density, normal liquid phase existing around the top of the NMR cell. The supercritical fluid phase and the normal liquid phase mix, thus greatly deteriorating the resolution of the NMR signal.

In addition to the problem of convection, there is another problem that new reactive gas or reactive liquid cannot be introduced because the inside of the NMR cell is in the normal pressure state or pressurized state. Furthermore, experiments on anaerobic systems cannot be conducted because it is impossible to remove the oxygen (air) from inside the NMR cell.

Under such high-temperature and high-pressure conditions, the high-pressure cell used for an NMR spectrometer is required to exhibit the following properties:

(1) During measurement, the homogeneity of the static magnetic field produced by the NMR spectrometer is not perturbed.

(2) During measurement, the radio frequency from the NMR spectrometer is not blocked.

(3) During measurement, the produced NMR background signal is low.

(4) A pressure of several 10 MPa can be applied to the sample.

(5) During NMR measurement, the pressure applied to the sample can be controlled.

(6) When a high pressure is applied to the sample, no leakage occurs from the joint of the cell.

(7) The sample can be easily loaded and exchanged. The cell can be easily cleaned.

(8) The temperature of the cell can be controlled under a high-pressure condition.

There is a strong demand for development of a high-pressure cell that is adapted for use in an NMR spectrometer and satisfies these conditions.

SUMMARY OF THE INVENTION

In view of the foregoing, it is an object of the present invention to provide an NMR cell system adapted for use in supercritical fluid measurements and having an NMR cell in which convection can be prevented and into which reactive gases and reactive liquids can be supplied smoothly, the NMR cell being further characterized in that the oxygen (air) in the cell can be removed before measurement.

It is another object of the present invention to provide a high-pressure cell which is for use in an NMR spectrometer, does not perturb the homogeneity of the static magnetic field produced in the NMR spectrometer during measurement, does not block the radio frequency generated from the NMR spectrometer, produces only low NMR background signals, permits a high pressure of several 10 MPa to be applied to the sample, permits the pressure applied to the sample to be controlled during NMR measurement, does not permit leakage from the joint of the cell during application of the high pressure to the sample, facilitates loading a sample, exchanging the cell, and cleaning the cell, and permits the sample temperature to be controlled under high-pressure conditions.

An NMR cell system for supercritical fluid measurements in accordance with the present invention has a cylindrical cell having a bottom and receiving a sample, a cell holder mounted at the open end of the cell, and an external pumping system. This NMR cell system is characterized in that a pipe is mounted to the cell holder to connect the external pumping system into the cell.

As another feature of this NMR cell system, the cell and the cell holder are made of a nonmagnetic material that withstands high temperatures, high pressures, and strong acidity.

As a further feature, the cell is made of a material that does not block a radio frequency and produces only low background signals in a given observed region of NMR.

As still another feature, the cell is made of a ceramic or sapphire.

As yet another feature, the cell holder is made of a titanium alloy.

As a still further feature, the aforementioned pumping system comprises a vacuum pump for evacuating the inside of the NMR cell system for supercritical fluid measurements and a pressure pump for introducing a sample into the cell after evacuation and applying pressure to the sample in the cell.

As a yet further feature, the above-described pumping system is equipped with a cleaning pump for cleaning the pipe of the NMR cell system for supercritical fluid measurements.

As an additional feature, a pressure system using a piston is mounted at one end of the cell to separate pressurized materials from the sample in the cell.

The present invention further provides an NMR cell system for supercritical fluid measurements, the system comprising a cell having a bottom, a cell holder mounted at the open end of the cell that receives a sample, and an external pumping system.

As one feature of this NMR cell system, a cell space-limiting means is mounted inside the cell to prevent convection of a supercritical fluid.

As another feature, the cell and the cell holder are made of a nonmagnetic material that withstands high temperatures, high pressures, and strong acidity.

As a further feature, the cell and the cell space-limiting means are made of a material that does not block a radio frequency and produces low background signals in a given observed region of NMR.

As yet another feature, the cell and the cell space-limiting means are made of a ceramic or sapphire.

Furthermore, the present invention provides a high-pressure cell for use in an NMR spectrometer, the high-pressure cell comprising a pressure-proof cell for receiving a sample to be investigated, a pressure transfer tube for transmitting pressure to the sample inside the pressure-proof cell, and a connector portion for coupling together the pressure-proof cell and the pressure transfer tube.

As one feature of this high-pressure cell for use in an NMR spectrometer, the pressure-proof cell is detachably mounted to the connector portion via a sealing member.

As yet another feature, the sealing member is an O-ring or a backup ring.

As an additional feature, the backup ring is made of a light metal (such as aluminum), copper, or a synthetic resin (such as Teflon).

In addition, the present invention provides a high-pressure cell for use in an NMR spectrometer, the high-pressure cell comprising a pressure-proof cell for receiving a sample to be investigated, a pressure transfer tube for transmitting pressure to the sample inside the cell, and a coupling portion for coupling together the pressure-proof cell and the pressure transfer tube. This high-pressure cell is characterized in that the pressure applied to the sample to be investigated can be varied while the pressure-proof cell is set in the measuring portion of the NMR spectrometer.

Further, the present invention provides a high-pressure cell for use in an NMR spectrometer, the high-pressure cell comprising a pressure-proof cell for receiving a sample to be investigated, a pressure transfer tube for transmitting pressure to the sample inside the pressure-proof cell, and a coupling portion for coupling together the pressure-proof cell and the pressure transfer tube. This high-pressure cell is characterized in that the temperature of the sample to be investigated can be varied while the pressure-proof cell is set in the measuring portion of the NMR spectrometer.

Other objects and features of the invention will appear in the course of the description thereof, which follows.

DESCRIPTION OF THE PREFERRED EMBODIMENTS

Figure 3:
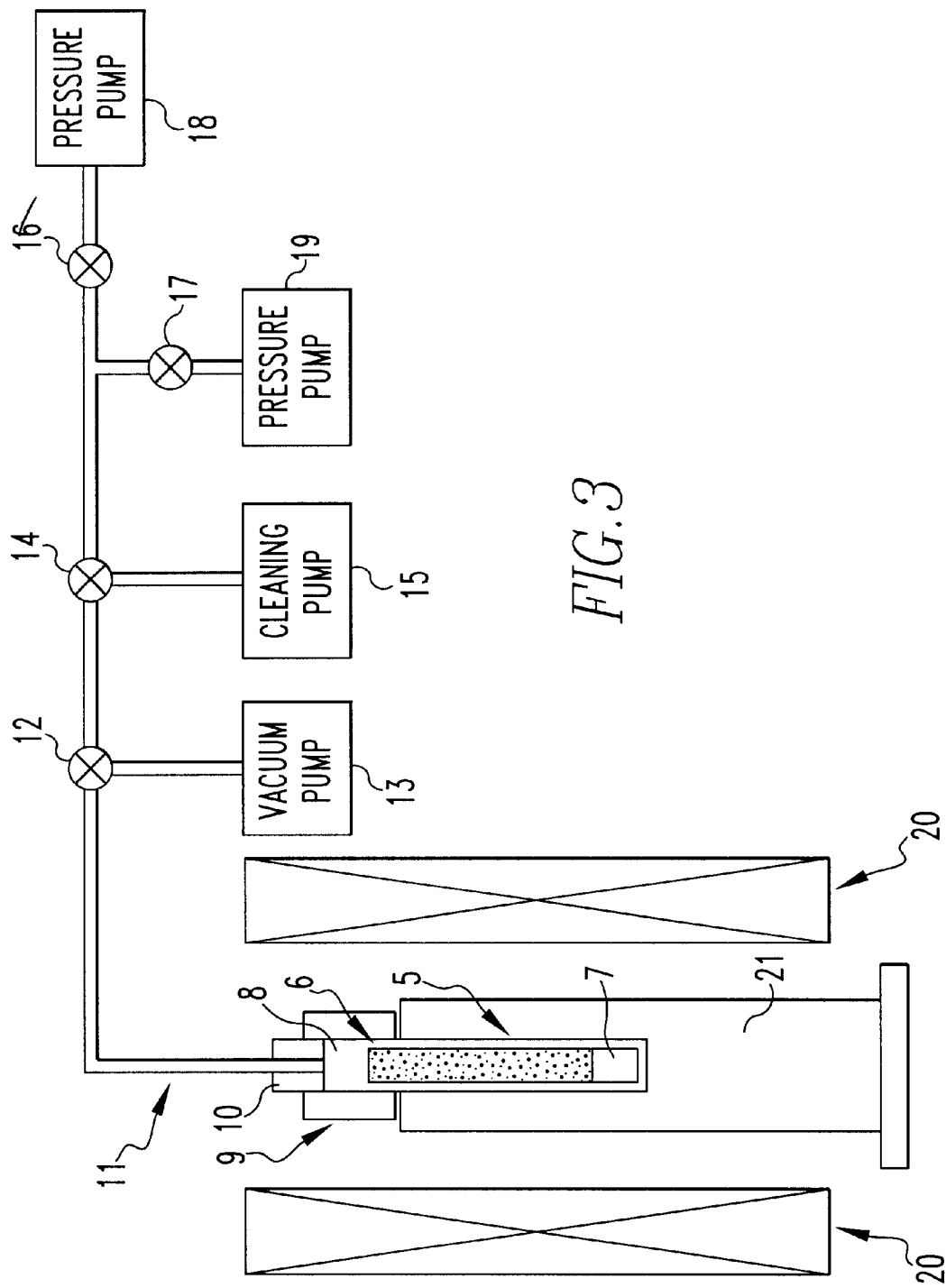
FIG. 3 is a block diagram of an NMR cell system built in accordance with the present invention and used for supercritical fluid measurements.

Referring to FIG. 3, there is shown an NMR cell system for use in supercritical fluid measurements, the NMR cell system being built in accordance with the present invention. This NMR cell system is adapted for a system in which a supercritical fluid is created at a relatively low temperature and at a relatively low pressure, such as liquefied carbon dioxide. The NMR cell system has a cylindrical NMR cell 5 having a bottom. This cylindrical cell has an outside diameter of 10 mm and an inside diameter of 5 mm. An inner plug 6 having a diameter of 4.6 mm is inserted in the NMR cell 5 to limit the cell space.

A gap of about 0.2 mm is left between the NMR cell 5 and the inner plug 6 to place a space 7 located below the plug 6 in communication with a space 8 located over the plug. The position of the inner plug 6 is so adjusted that the length of the space formed below the inner plug 6 is about twice the length (1.5 to 2 cm) of an NMR detection coil (not shown), i.e., approximately 3 to 4 cm. The NMR cell 5 and the inner plug 6 are made of a nonmagnetic material, such as a ceramic (e.g., zirconia) or sapphire, which does not block the radio frequency emitted from the NMR spectrometer, withstands high temperatures, high pressures, and strong acidity, and produces only low background signals in a given observed region of NMR.

The NMR cell 5 has an open end at which a cell holder 9 is mounted. This holder 9 is made of a nonmagnetic material, such as a titanium alloy, which does not perturb the homogeneity of the static magnetic field and which withstands high temperatures, high pressures, and strong acidity. The cell holder 9 is connected to a pipe 11 made of stainless steel via a pipe connector portion 10 made of a titanium alloy and stainless steel. The cell holder 9 and the pipe connector portion 10 together form a subassembly, which is referred to herein as the cell holder subassembly or simply as the cell holder.

A vacuum pump 13 is connected with the pipe 11 via a selector valve 12. A cleaning pump 15 is connected with the pipe 11 via another selector valve 14. Pressure pumps 18 and 19 are connected with the pipe 11 via selector valves 16 and 17, respectively.

This NMR cell 5 is inserted into an NMR probe 21 from above and placed in position in the same way as ordinary NMR cells and used for NMR measurements. The NMR probe 21 is placed between magnets 20 that produce a static magnetic field. A sample temperature control device (not shown in FIG. 3) is incorporated in the NMR probe 21 to blow temperature-controlled air toward the NMR cell 5. In this way, the temperature of the sample inside the NMR cell 5 can be raised up to 400° C.

The sample is introduced into the NMR cell 5 in the manner described below. First, the selector valve 12 for the pipe 11 is opened to evacuate the inside of the NMR cell 5 by the vacuum pump 13. As a result, the spaces 7 and 8 located below and over, respectively, the NMR cell 5 assume a vacuum state. After completion of the evacuation, the selector valve 12 is closed. Then, the selector valves 16 and 17 are opened. A medium, such as liquefied carbon dioxide or water, and a reactive reagent are simultaneously fed into the NMR cell 5 by the use of the two pressure pumps 18 and 19.

Since the inside of the NMR cell 5 has been previously evacuated, the medium and the reactive reagent can be easily introduced into the lower space 7 as well as into the upper space 8 via the gap between the NMR cell 5 and the inner plug 6. Furthermore, oxygen (air) has been previously removed and so experiments on anaerobic systems can be conducted advantageously. After completion of the introduction of the medium and the reactive reagent, the selector valves 16 and 17 are closed. The medium, such as liquefied carbon dioxide or water, introduced in this way is heated under pressure. Consequently, a supercritical fluid is created.

An NMR measurement of a supercritical fluid is carried out in exactly the same way as ordinary NMR measurements. After the NMR measurement of the supercritical fluid, the NMR cell 5 is removed from the pipe 11. Then, the contents of the cell are extracted, and the cell is cleaned, thus making preparations for the next measurement. When the NMR cell 5 is removed, if the inside of the pipe 11 is contaminated with the sample, the selector valve 14 is opened to feed a cleaning liquid from the cleaning pump 15, cleaning the inside of the pipe.

In this structure, the presence of the inner plug 6 is quite important. That is, if the plug 6 were not present, a violent convection would occur between a created supercritical fluid and a fluid not yet changed into a supercritical state, thereby hindering NMR measurement as mentioned previously as the problem with the prior art technique. However, the presence of the inner plug 6 defines the lower space 7. The liquid under pressure inside the lower space 7 is heated by the sample temperature control device (not shown). If this liquid is heated above its critical point and assumes a supercritical fluid phase, a violent convection will take place between the liquid in the lower space and the unheated liquid phase under pressure that is located in the upper space 8. In spite of this, the boundary between these two phases lies just in a narrow gap of only about 0.2 mm between the NMR cell 5 and the inner plug 6. Therefore, the convection is limited to this narrow gap. It is unlikely that the convective stream passes across the gap and enters the lower space 7 where an NMR measurement is made or that the convection perturbs the supercritical fluid phase in the lower space 7. In consequence, the resolution of the NMR signal is prevented from being perturbed due to the convection.

Figure 4:
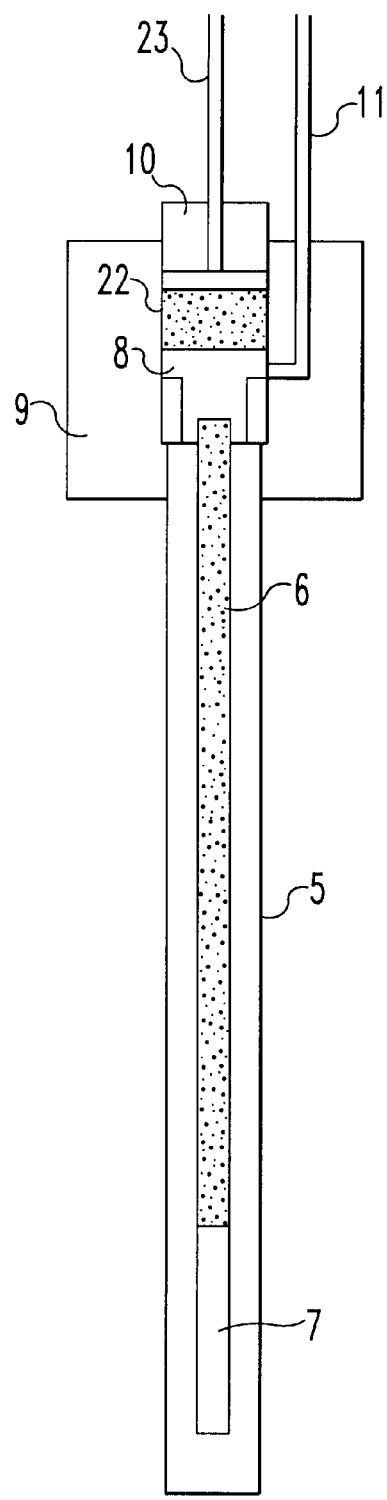
FIG. 4 is a vertical cross section of another NMR cell system built in accordance with the present invention and used for supercritical fluid measurements.

Referring next to FIG. 4, there is shown another NMR cell system in accordance with the present invention, the NMR cell system being used for supercritical fluid measurements. This embodiment is relatively adapted for applications in which a supercritical fluid is created at relatively high temperature and pressure, such as water or alcohol. This system has a cylindrical NMR cell 5 having a bottom. The cell 5 has an outside diameter of 5 mm and an inside diameter of 1.5 mm. An inner plug 6 having a diameter of 1.1 mm is inserted in the NMR cell 5 to limit the cell space.

A gap of about 0.2 mm is left between the NMR cell 5 and the inner plug 6 to place a space 7 formed below the plug 6 in communication with a space 8 formed over the plug. The position of the inner plug 6 is so adjusted that the length of the space below the plug 6 is about twice the length of an NMR detection coil of 1.5 to 2 cm, i.e., approximately 3 to 4 cm. The NMR cell 5 and the inner plug 6 are made of a nonmagnetic material, such as a ceramic (e.g., zirconia) or sapphire, which does not block the radio frequency emitted from the NMR spectrometer, withstands high temperatures, high pressures, and strong acidity, and produces only low background signals in a given observed region of NMR.

The NMR cell 5 has an open end at which a cell holder 9 is mounted. This holder 9 is made of a nonmagnetic material, such as a titanium alloy, which does not perturb the homogeneity of the static magnetic field and which withstands high temperatures, high pressures, and strong acidity. The cell holder 9 is connected to a pipe 11 made of stainless steel via a pipe connector portion 10 made of a titanium alloy and stainless steel. The cell holder 9 and the pipe connector portion 10 together form a subassembly, which is referred to herein as the cell holder subassembly or simply as the cell holder. A piston 22 is mounted in the upper space 8 to permit pressure from a pressurized medium, such as oil, to be applied to the inside of the NMR cell 5 via a pressure transfer tube 23. Since the pressurized medium and the supercritical fluid are separately treated, the pressure inside the NMR cell 5 can be monitored independently.

A vacuum pump, a cleaning pump, and a pressure pump (none of which are shown) are connected with the pipe 11 via selector valves (not shown) in the same way as in the embodiment described previously in connection with FIG. 3.

This NMR cell 5 is inserted into an NMR probe (not shown) from above and placed in position in the same way as ordinary NMR cells and used for NMR measurements. The NMR probe is placed between magnets that produce a static magnetic field. A sample temperature control device (not shown) is incorporated in the NMR probe to blow temperature-controlled air toward the NMR cell 5. In this way, the temperature of the sample inside the NMR cell 5 can be raised up to 400° C. The method of introducing the sample is exactly the same way as in the embodiment described in connection with FIG. 3. Also, the method of creating a supercritical fluid is exactly the same way as in the embodiment illustrated in FIG. 3.

The inner plug 6 plays exactly the same role as the inner plug of the embodiment illustrated in FIG. 3. The convection between the lower space 7 and the upper space 8 that are partitioned from each other by the inner plug 6 are spatially limited to prevent the supercritical fluid created in the lower space 7 from being engulfed in the convection.

In these embodiments, the inner plug having a diameter slightly smaller than the inside diameter of the NMR cell is inserted into the NMR cell to limit the cell space. The shape of this inner plug may be modified. That is, the gap between the NMR cell and the inner plug is sealed with an O-ring. The plug is centrally provided with a small hole to place the space below the NMR cell in communication with the space over the cell. It is considered that this method can prevent convection between the lower and upper spaces partitioned from each other by the inner plug 6.

In the embodiments of the NMR cell system for supercritical fluid measurements, the structure of the NMR cell to which a high pressure can be applied is described merely briefly. The structure of this high-pressure cell for use in an NMR spectrometer is described in detail below.

Figure 5:
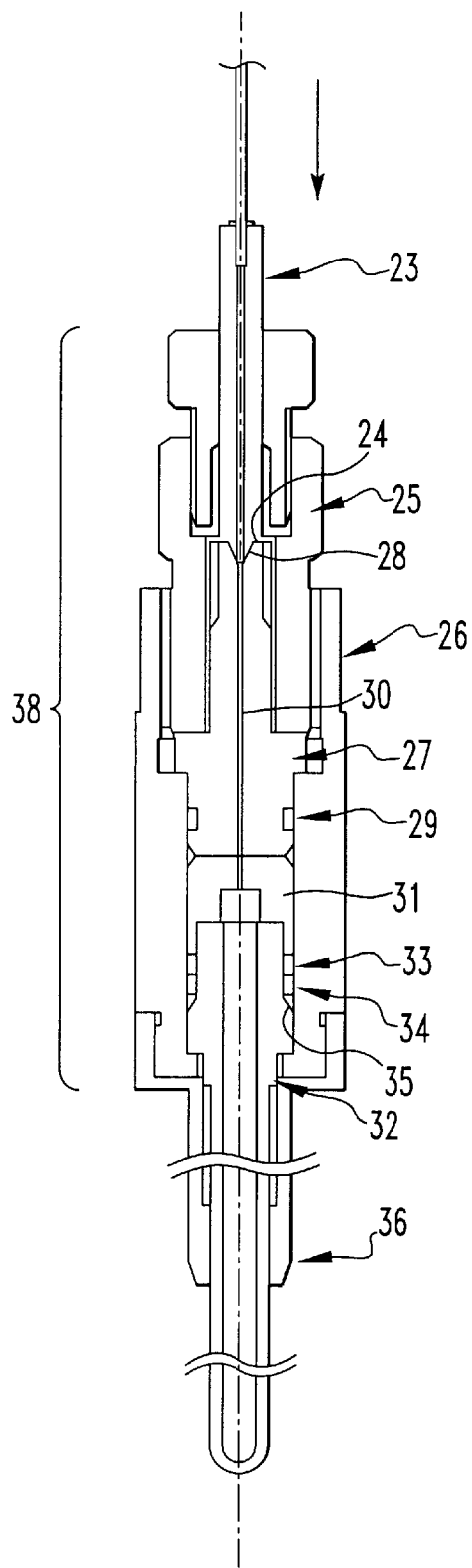
FIG. 5 is a vertical cross section of a high-pressure cell for use in an NMR spectrometer, the high-pressure cell being built in accordance with the present invention.

FIG. 5 shows one example of the high-pressure cell for use in an NMR spectrometer, the cell being built in accordance with the present invention. This high-pressure cell has a pressure transfer tube 23 for transmitting pressure generated by a high-pressure generator (not shown) to a sample under investigation via a pressure medium. A liquid (such as a fluorocarbon oil) that has no NMR signal in a given observed region or a gas (such as air or argon) is used as the pressure medium.

A tapering surface 24 is formed at the front end of the pressure transfer tube 23. The outer surface of a screw 25 is externally threaded. The inner surface of a body 26 is internally threaded. The screw 25 is screwed into the body 26, so that the screw is pressed against a tapering surface 28 at one end of a sleeve 27, thus providing a high-pressure seal. The gap between the body 26 and the sleeve 27 is sealed with an O-ring 29 under high pressure.

The sleeve 27 is centrally provided with a thin hole 30. Pressure transmitted from the pressure transfer tube 23 is transmitted and applied via the hole 30 and a spacer ring 31 to a pressure-proof cell 32 that receives a sample under investigation. The gap between the body 26 and the pressure-proof cell 32 is sealed under high pressure with an O-ring 33 and a backup ring 34.

When a high pressure is applied, the O-ring 33 is crushed toward the atmospheric side and bulges outward. Therefore, the backup ring 34 is mounted to back up the high-pressure seal provided by the O-ring 33. The backup ring 34 is made of a light metal (such as aluminum), copper, or a synthetic resin (such as Teflon). If the pressure applied to the high-pressure portion exceeds the pressure that can be sealed by the O-ring 33, the backup ring 34 is pushed against a tapering surface 35 formed on the outer surface of the top portion of the pressure-proof cell 32, it is deformed and it makes intimate contact with the tapering surface, thus sealing the high-pressure portion.

The pressure-proof cell 32 is made of a nonmagnetic material (e.g., a ceramic (such as zirconia) or sapphire) that can sufficiently withstand the applied high temperature, high pressure, and strong acidity, produces only low NMR background signal in a given observed region, does not block a radio frequency, and does not perturb the homogeneity of the static magnetic field produced in the NMR spectrometer. In the present embodiment, the pressure-proof cell 32 can withstand up to about 400° C. and 500 atm.

Figure 6:
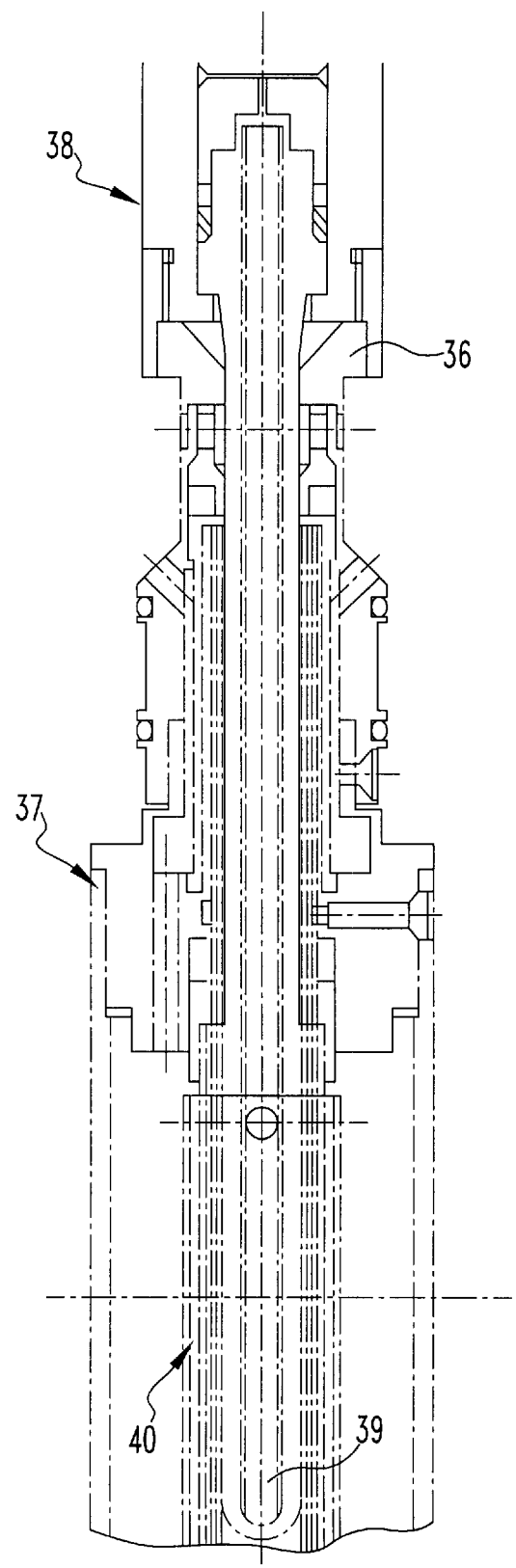
FIG. 6 is a vertical cross section illustrating the manner in which a high-pressure cell for use in an NMR spectrometer is mounted in an NMR probe, the high-pressure cell being built in accordance with the present invention.

The contours and dimensions of the pressure-proof cell 32 and of a support 36 exposed from the lower end of the body 26 are designed such that the cell can be inserted into various NMR probes and used. For example, FIG. 6 shows the manner in which the pressure-proof cell is mounted in a high-temperature NMR probe. The support 36 fits into the sample insertion port in an NMR probe 37, thus helping mount the pressure-proof cell securely relative to the NMR probe 37. Accordingly, depending on the kind of the NMR probe 37 in which the pressure-proof cell is mounted, it is necessary to modify the shape of the support 36. In the present embodiment, the pressure-proof cell can be mounted in any arbitrary type of NMR probe by exchanging the support 36.

Owing to the structure described above, the present embodiment can have some merits. A subassembly including the screw 25, the body 26, the sleeve 27, and the spacer ring 31, and acting to couple together the pressure transfer tube 23 and the pressure-proof cell 32 is referred to as the connector portion 38. Since this connector portion 38 is sealed only by the O-ring and backup ring, it is easy to detach the pressure-proof cell 32 from the connector portion 38. That is, it is easy to load a sample into the pressure-proof cell 32, to exchange the pressure-proof cell 32 with a new one, and to clean the pressure-proof cell 32. Hence, the instrument is excellent in maintainability as a measuring instrument.

Additionally, the high-pressure cell can be placed in position within the NMR probe 37 while the pressure transfer tube 23 remains connected. Therefore, the pressure applied to the sample under investigation can be controlled while the sample remains inserted in the NMR probe 37. That is, in the present embodiment, a stop valve (not shown) mounted in the pressure transfer tube 23 is closed, and NMR measurements can be performed while keeping the inside of the pressure-proof cell at a given high pressure. Furthermore, during NMR measurement, the stop valve can be opened. Therefore, if necessary, the applied pressure can be controlled or varied while performing NMR measurement.

In the present embodiment, the dimensions of the contour of the pressure-proof cell 32 are so set that the cell can be used together with existing various sample temperature control devices. Therefore, if a sample temperature control device has been previously mounted in the NMR probe 37, NMR measurements can be performed while varying the sample temperature over a wide range by directly blowing temperature-controlling gas against the pressure-proof cell 32 while controlling the pressure applied to the sample under investigation. This variableness of experimental conditions is one of the items essential for measurements of high-temperature, high-pressure supercritical fluids, for example.

Figure 1:
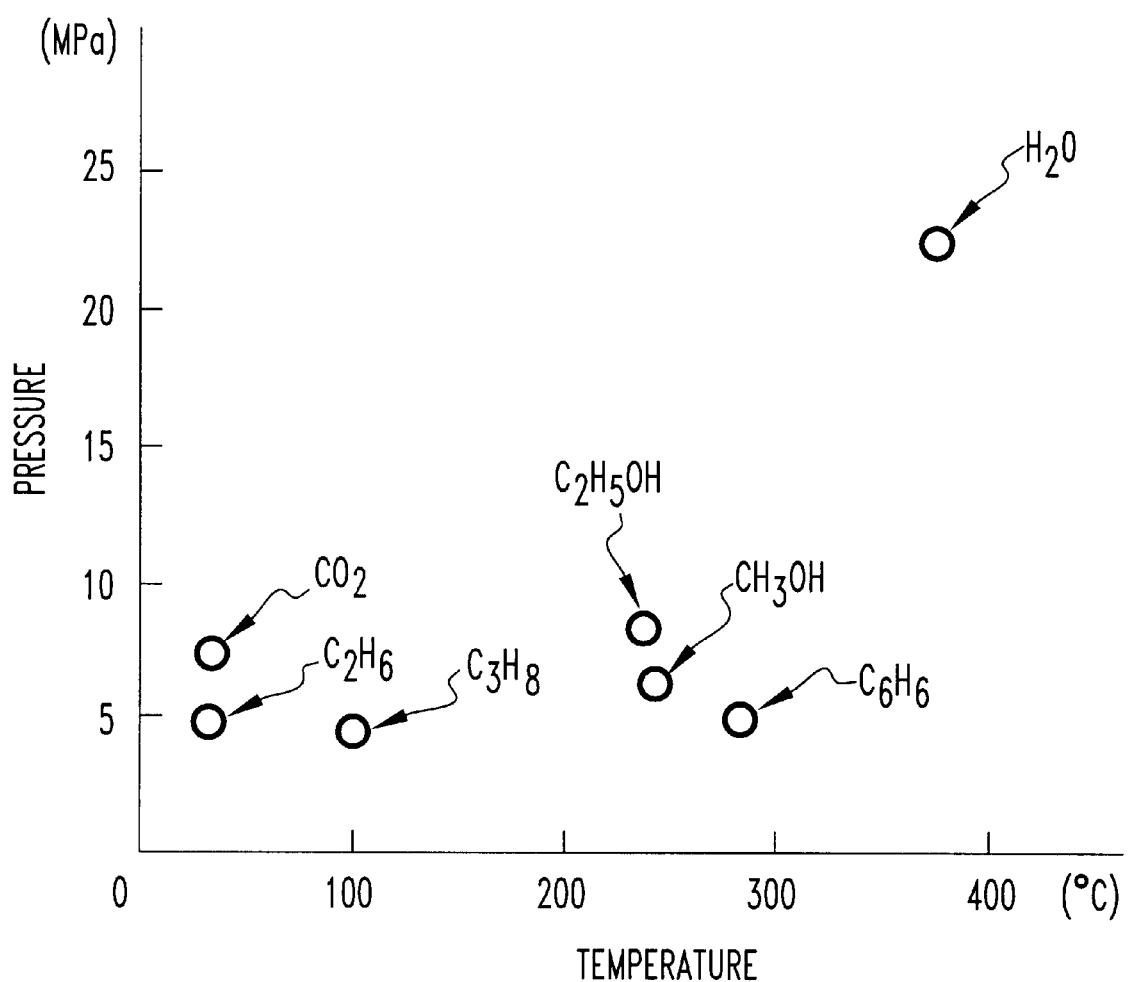
FIG. 1 is a diagram illustrating the critical points of various media.
Figure 2:
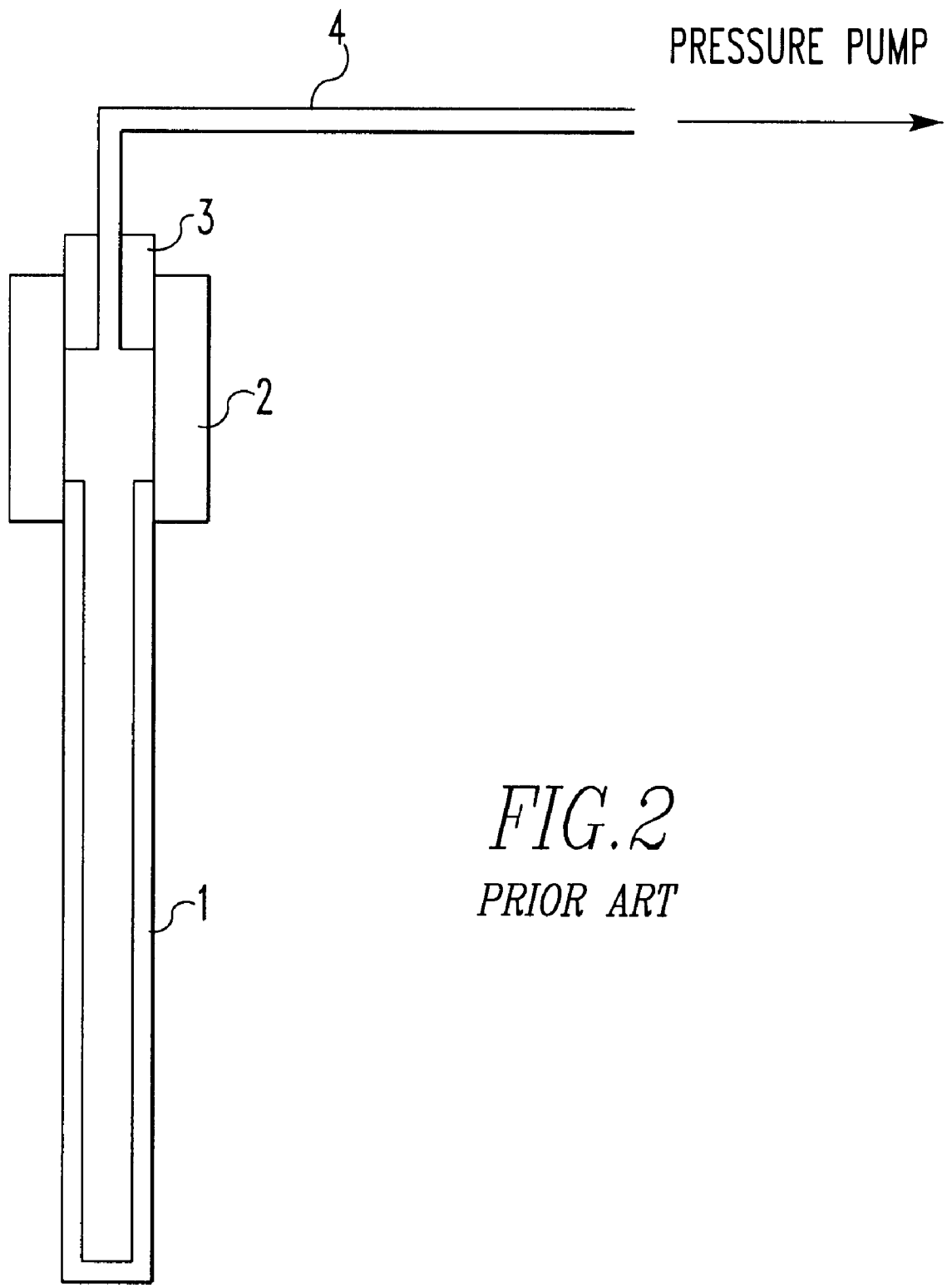
FIG. 2 is a vertical cross section of the prior art NMR cell system for supercritical fluid measurements.

Since the dimensions of the contour of the pressure-proof cell 32 are the same as those of an ordinary NMR cell, a sample 39 under investigation can be placed as close as to an NMR detection coil 40 in the same way as where the conventional method is exploited, as shown in FIG. 2. If the distance between the sample 39 and the NMR detection coil 40 is great, the detection sensitivity of the NMR spectrometer will deteriorate extremely. Consequently, it is quite important to maintain the same distance as used conventionally.

Furthermore, the instrument can suit various types of NMR probes by varying the shape of the support 36. Therefore, the instrument can perform high-pressure NMR measurements under various magnetic fields and frequencies, using only one high-pressure cell. That is, NMR measurements are not limited to certain nuclear species. Rather, various nuclear species can be investigated by NMR spectroscopy with one high-pressure cell.

As described thus far, with the NMR cell system built in accordance with the present invention and adapted for use in supercritical fluid measurements, the convection between a supercritical fluid and an ordinary fluid is prevented from spreading to the whole NMR cell. Before introducing a medium and a reactive agent into an NMR cell, the inside of the NMR cell is evacuated by a vacuum pump. Therefore, the medium and the reactive reagent can be brought to the front end of the NMR cell smoothly. In addition, the NMR cell system is adapted for measurements of anaerobic systems.

In an NMR high-pressure cell in accordance with the present invention, a pressure-proof cell is detachably mounted to a connector portion via a sealing member, the connector portion acting to couple together the pressure-proof cell and a pressure transfer tube. Therefore, during measurements, the cell exhibits high maintainability. Additionally, the pressure applied to the sample and the temperature can be varied while the pressure-proof cell is placed in position within the NMR probe. Hence, this is suitable for researches into supercritical fluids and so on. Further, the NMR cell has high generality because it can be used in various types of NMR probes.

Having thus described our invention with the detail and particularity required by the Patent Laws, what is desired protected by Letters Patent is set forth in the following claims.

What is claimed is:

1. An NMR cell system for supercritical fluid measurements, said NMR cell system comprising:
    a cylindrical cell having a bottom and receiving a sample, said cell having an open end;
    a cell holder mounted at the open end of said cylindrical cell;
    an external pumping system comprising a vacuum pump for evacuating the inside of said cylindrical cell before introducing a sample and a pressure pump for introducing a sample into said cylindrical cell after the evacuation and applying pressure to the sample; and
    a pipe mounted in said cell holder and acting to connect said external pumping system into said cylindrical cell, said pipe configured for evacuating said cell and introducing a sample.

2. The NMR cell system of claim 1, wherein said cylindrical cell and said holder are made of a nonmagnetic material that withstands high temperatures, high pressures, and strong acidity.

3. The NMR cell system of claim 1 or 2, wherein said cylindrical cell is made of a material that does not block a radio frequency and produces only low background signals in a given observed region of NMR.

4. The NMR cell system of claim 1 or 2, wherein said cylindrical cell is made of a ceramic or sapphire.

5. The NMR cell system of claim 1 or 2, wherein said cell holder is made of a titanium alloy.

6. The NMR cell system of claim 1 or 2, wherein said pumping system incorporates a cleaning pump for cleaning the pipe in said NMR cell system.

7. An NMR cell system for supercritical fluid measurements, said NMR cell system comprising:
    a cylindrical cell having a bottom and receiving a sample, said cell having an open end;
    a cell holder mounted at the open end of said cylindrical cell;
    an external pumping system; and
    a cell space-limiting means formed inside said cylindrical cell to prevent convection of a supercritical fluid.

8. The NMR cell system of claim 7, wherein said cylindrical cell and said cell space-limiting means are made of a nonmagnetic material that withstands high temperatures, high pressures, and strong acidity.

9. The NMR cell system of claim 7 or 8, wherein said cylindrical cell and said cell space-limiting means are made of a material that does not block a radio frequency and produces only low background signals in a given observed region of NMR.

10. The NMR cell system of claim 7 or 8, wherein said cylindrical cell and said cell space-limiting means are made of a ceramic or sapphire.

11. The NMR cell system of claim 7, wherein said cell holder is made of a nonmagnetic material that withstands high temperatures, high pressures, and strong acidity.

12. The NMR cell system of claim 7 or 11, wherein said cell holder is a titanium alloy.

13. An NMR cell system for supercritical fluid measurements, said NMR cell system comprising:
    a cylindrical cell having a bottom and receiving a sample, said cell having an open end;
    a cell holder mounted at the open end of said cylindrical cell, said cell holder arranged as a cylinder for pressurizing the sample;
    a piston mounted inside said cell holder to separate pressurized materials from the sample and applying pressure to said sample in said cell;

an external pumping system for introducing a sample into said cylindrical cell and applying pressure to said sample;

a pipe connected with the upper space of said piston in communication with said external pumping system, said pipe being used for applying pressure to the sample; and another pipe connected with the lower space of said piston in communication with said cylindrical cell, said pipe being used for introducing a sample into said cylindrical cell.

14. The NMR cell system of claim 13, wherein said cylindrical cell and said holder are made of a nonmagnetic material that withstands high temperatures, high pressures, and strong acidity.

15. The NMR cell system of claim 13 or 14, wherein said cylindrical cell is made of a material that does not block a radio frequency and produces only low background signals in a given observed region of NMR.

16. The NMR cell system of claim 13 or 14, wherein said cylindrical cell is made of a ceramic or sapphire.

17. The NMR cell system of claim 13 or 14, wherein said cell holder is made of a titanium alloy.

* * * * *